United States Patent (12) United States Patent
Taguchi (10) Patent No.: US 9,419,411 B2
(45) Date of Patent: Aug. 16, 2016

(54) SEMICONDUCTOR LASER DIODE

(71) Applicant: Sumitomo Electric Device Innovations, Inc., Yokohama-shi (JP)

(72) Inventor: Toshiyuki Taguchi, Yokohama (JP)

(73) Assignee: Sumitomo Electric Device Innovations, Inc., Yokohama-shi (JP)

(*) Notice: Subject to any disclaimer, the term of this patent is extended or adjusted under 35 U.S.C. 154(b) by 0 days.

(21) Appl. No.: 14/727,426

(22) Filed: Jun. 1, 2015

(65) Prior Publication Data

US 2015/0349490 A1  Dec. 3, 2015

(30) Foreign Application Priority Data

Jun. 2, 2014  (JP) ................................ 2014-114098

(51) Int. Cl.
| | |
|---|---|
| H01S 5/042 | (2006.01) |
| H01S 5/062 | (2006.01) |
| H01S 5/343 | (2006.01) |
| H01S 5/20 | (2006.01) |
| H01S 5/22 | (2006.01) |

(52) U.S. Cl.
CPC ............... *H01S 5/062* (2013.01); *H01S 5/0425* (2013.01); *H01S 5/2031* (2013.01); *H01S 5/22* (2013.01); *H01S 5/3434* (2013.01); *H01S 5/0422* (2013.01); *H01S 5/0427* (2013.01)

(58) Field of Classification Search
CPC .... H01S 5/0422; H01S 5/0425; H01S 5/0427
See application file for complete search history.

(56) References Cited

U.S. PATENT DOCUMENTS

| | | | | |
|---|---|---|---|---|
| 2007/0290360 | A1* | 12/2007 | Akage | .................... B82Y 20/00 257/773 |
| 2015/0063394 | A1* | 3/2015 | Iwata | ...................... H01S 5/183 372/45.01 |
| 2015/0092803 | A1 | 4/2015 | Yamasaki et al. | |

FOREIGN PATENT DOCUMENTS

JP        05-029703 A     2/1993

OTHER PUBLICATIONS

Yamasaki et al., U.S. Appl. No. 14/500,093, "Laser Diode and Transmitter Module", filed Sep. 29, 2014.

* cited by examiner

*Primary Examiner* — Tod T Van Roy
(74) *Attorney, Agent, or Firm* — Venable LLP; Michael A. Sartori; Laura G. Remus (57) ABSTRACT

A semiconductor laser diode is disclosed. The semiconductor laser diode including a primary surface constituted by two short sides and two long sides, comprises: an active layer; an electrode provided above the active layer; a first pad connected to the electrode; a second pad connected to the first pad; an inner interconnection configured to connect the electrode to the first pad electrically, the inner interconnection being provided along the long sides; and an outer interconnection configured to connect the first pad to the second pad electrically, the outer interconnection being provided along the long sides, the outer interconnection having a width along the short sides narrower than a width of the first pad along the short sides and a width of the second pad along the short sides. The active layer, the first pad, and the second pad are arranged along the long sides.

11 Claims, 6 Drawing Sheets

Fig. 5

SEMICONDUCTOR LASER DIODE

CROSS REFERENCE TO THE RELATED APPLICATION

This application is related to patent application Ser. No. 14/500,093 filed Sep. 29, 2014, which is hereby incorporated, by reference.

BACKGROUND

1. Field of the Invention

The present invention relates to a semiconductor laser diode (LD).

2. Background Arts

As an oscillation device in optical communication, a direct-modulation-type semiconductor laser diode is used. Both a modulation signal and a bias current are supplied to one electrode of this semiconductor laser diode. For example, Japanese Patent Application Laid-Open No. 5-29703 discloses a semiconductor laser diode, in which a pad is connected to one electrode. Typically, a wire for supplying a modulation signal and a wire for supplying a bias current are respectively bonded to this pad.

SUMMARY

In recent years, there is demand for a semiconductor laser diode capable of realizing higher-speed, such as 15 GHz to 30 GHz, modulation. In such a semiconductor laser diode, a high-speed modulation technique is studied which is realized by shortening a resonator length of the semiconductor laser diode. In this case, the size of the pad to be disposed, at the semiconductor laser diode is limited. Therefore, design margin, which is set for bonding both the wire for supplying a modulation signal and the wire for supplying a bias current to the pad, could be lost in the shape of the pad. Further, such smaller pad may degrade productivity because it takes time to bond the wires to the pad in manufacturing process.

One aspect of the present application relates to a semiconductor laser diode including a primary surface constituted by two short sides and two long sides. The semiconductor laser diode comprises: an active layer having a direction of optical output along to the short sides of the primary surface; an electrode provided above the active layer to supply carriers within the active layer; a first pad provided on the primary surface, the first pad being connected to the electrode electrically; a second pad provided on the primary surface, the second pad being connected to the first pad electrically; an inner interconnection configured to connect the electrode to the first pad electrically, the inner interconnection being provided along the long sides; and an outer interconnection configured to connect the first pad to the second pad electrically, the outer interconnection being provided along the long sides, the outer interconnection having a width along the short sides narrower than a width of the first pad along the short sides and a width of the second pad along the short sides. The active layer, the first pad, and the second pad are arranged along the long sides.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

A preferred embodiment of the present invention will be described in detail below with reference to the accompanying drawings. It should be noted that in the following description, the same reference numerals will be used for the same elements or elements having the same functions, and overlapped explanation will be omitted.

Figure 1:
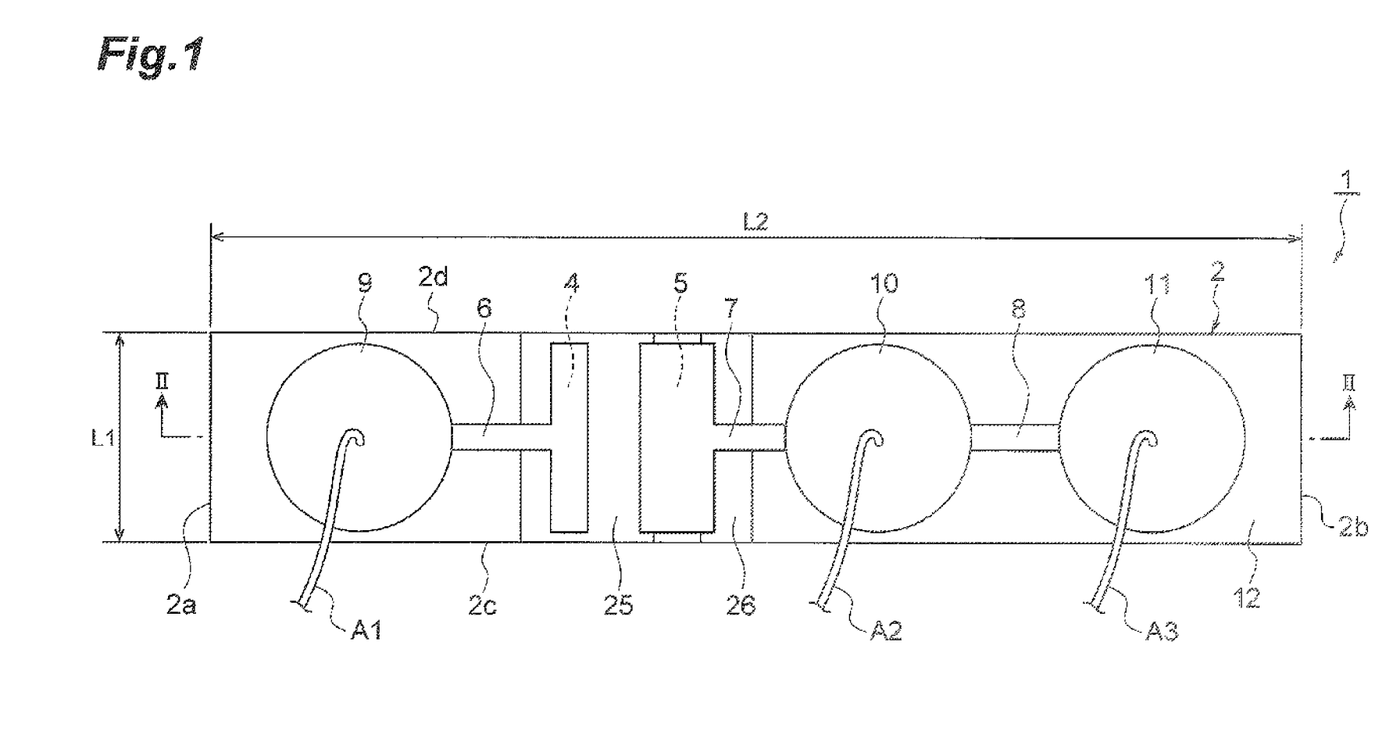
FIG. 1 is a plan view illustrating a semiconductor laser diode according to the present embodiment.
Figure 2:
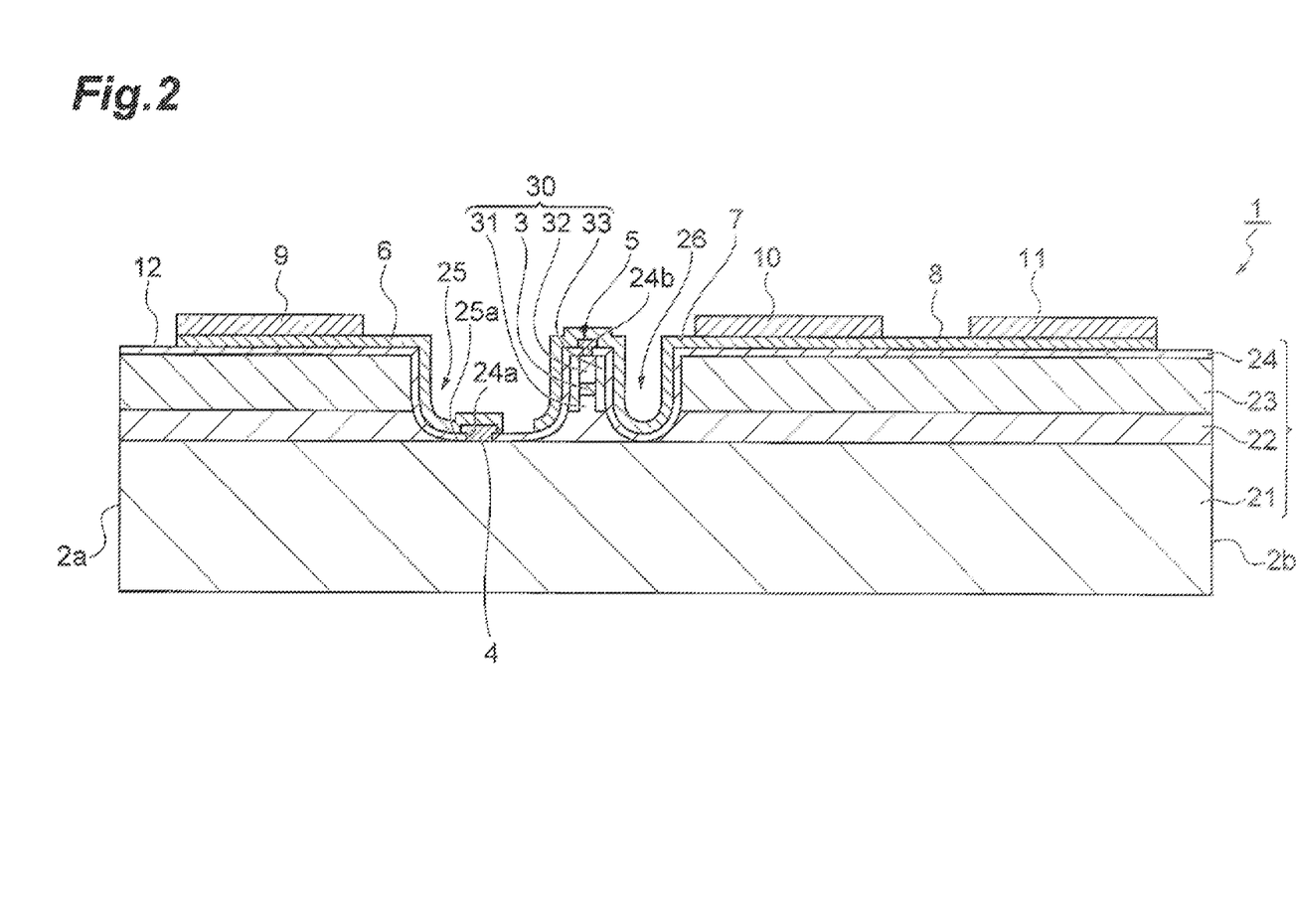
FIG. 2 is a cross-sectional, view along a line II-II of FIG. 1.

FIG. 1 is a plan view illustrating a semiconductor laser diode according to the present embodiment. FIG. 2 is a cross-sectional view along a line II-II of FIG. 1. As illustrated in FIG. 1 and FIG. 2, a semiconductor laser diode (LD) 1 includes a chip 2, an active layer 3, a cathode 4, an anode 5, interconnections 6 to 8 and pads 9 to 11. The chip 2 has a substantially quadrangular, such as rectangular, primary surface 12 including a pair of short sides 2a, 2b facing each other and a pair of long sides 2c, 2d facing each, other. The length L1 of the pair of short sides 2a, 2b is, for example, between 100 μm and 150 μm. The length L2 of the pair of long sides 2c, 2d is, for example, between 400 μm and 500 μm.

The chip 2 has at least a substrate 21, a lower cladding layer 22, an embedding layer 23 and an instating film 24. The substrate 21 is, for example, an n-type InP substrate. The lower cladding layer 22 is provided on the substrate 21, and is, for example, an n-type InP layer. The thickness of the lower cladding layer 22 is, for example, 0.5 μm. The embedding layer 23 is provided on the lower cladding layer 22, and is, for example, an InP layer doped with iron (Fe). The thickness of the embedding layer 23 is, for example, 1.5 μm. The insulating film 24 which covers the substrate 21, the lower cladding layer 22 and the embedding layer 23, is, for example, a silicon oxide film. The thickness of the insulating film 24 is, for example, 0.6 μm.

A pair of grooves 25, 26 extending in parallel to the short-side 2a are provided at part of the primary surface 12 of the chip 2. The grooves 25, 26 are formed by removing part, of the lower cladding layer 22 and part of the embedding layer 23. The width of the groove 25 is wider than the width of the groove 26. A surface of the grooves 25, 26, except some part, is covered by the insulating film 24. Specifically, an opening 24a is provided at part of the insulating film 24 which covers a bottom 25a of die groove 25, and the substrate 21 is exposed at the bottom of the opening 24a. The cathode 4 buries this opening 24a. The cathode 4 is in contact with the substrate 21 via the opening 24a, and is electrically connected to the active layer 3 via the substrate 21. The cathode 4 is, for example, an alloy layer of AuZn or an alloy layer including these metals.

A mesa 30 is provided in a region between the grooves 25, 26. The mesa 30, which is part of the chip 2, has a lower cladding layer 31, an upper cladding layer 32, an active layer 3 end a embedding layer 33. The lower cladding layer 31 is an retype InP layer which is the same as the lower cladding layer 22. The upper cladding layer 32 is provided above the lower cladding layer 31 and is, for example, a p-type InP layer. The thickness of the upper cladding layer 32 is, for example, 1.3 μm. The embedding layer 33 is part of the embedding layer 23.

The active layer 3 is an optical waveguide layer. The active layer 3 emits light in a direction parallel to the short sides 2a, 2b and orthogonal to the long sides 2c, 2d. The direction is a direction of optical output along to the short sides 2a, 2b. The active layer 3 is surrounded by the lower cladding layer 31, the upper cladding layer 32 and the embedding layer 33. The thickness of the active layer 3 is, for example, 0.2 μm. The active layer 3 which has, for example, a multi quantum well (MQW) structure, has a plurality of InGaAsP layers. End faces (resonance end faces) of the active layer 3 are a pair of faces facing each other, one of which is exposed to the face including the long side 2c, and the other of which is exposed to the face including the long side 2d. Therefore, the resonator length of the LD 1 is substantially the same as the length L1 of the short sides 2a, 2b.

Another opening 24b is provided at part of the insulating film 24 on the mesa 30, and part of the upper cladding layer 32 is exposed at the bottom of the opening 24b. The anode 5 buries this opening 24b. The anode 5 is in contact with the upper cladding layer 32 via the opening 24b and serves as an electrode for supplying a current within the active layer 3. The anode 5 is, for example, an alloy such as AuZn or an alloy layer including these metals. A modulation signal and a bias signal, are supplied to the anode 5 through the inner interconnection 7, which will be described in detail later.

The interconnection 6 is a conductive layer extending outside of the mesa 30 from the cathode 4, that is, toward the short side 2a. The interconnection 6 is, for example, a metal layer mainly formed with gold (An), and a width of the interconnection 6 in a direction parallel to the short side 2a is, for example, 40 μm. One end of the interconnection 6 is connected to the cathode 4 inside the groove 25. The other end of the interconnection 6 is connected to the pad 9.

The pad 9, which has a circular planar shape, is provided on the interconnection 6 outside of the groove 25 with respect to the mesa 30. The diameter of the pad 9 is, for example, 60 μm. A wire A1 is connected to the surface of the pad 9.

The inner interconnection 7 is a conductive layer extending toward the short side 2b across the groove 26 from the anode 5 on the mesa 30. The inner interconnection 7 is, for example, a metal layer mainly formed with gold (Au), and the width of the inner interconnection 7 along the short side 2b is, for example, 40 μm. Because a modulation signal in addition to a bias signal are supplied to the inner interconnection 7, the length and the width of the inner interconnection 7 match impedance when the anode 5 is viewed from the inner interconnection 7, that is, the length and the width of the inner interconnection 7 correspond to matching conditions. Although one end of the inner interconnection 7 reaches inside of the groove 25 across the mesa 30, the one end of the inner interconnection 7 is electrically insulated from the cathode 4 and the interconnection 6 by the insulating film 24. The other end of the inner interconnection 7 is connected to the pad 10. That is, the inner interconnection 7 connects the anode 5 and the pad 10.

The pad 10, which has a circular planar shape, is provided on the primary surface 12 outside of the groove 25 with respect to the mesa 30. The diameter of the pad 10 is, for example, 60 μm. For example, a wire A2 for supplying a modulation signal to the mesa 30 is connected to the surface of the pad 10.

The outer interconnection 8 is a conductive layer extending outside of the pad 10, that is, toward the short side 2b. The outer interconnection 8 is, for example, a metal layer mainly formed with gold (Au), and the width along the short side 2b is, for example, 40 μm. One end of the outer interconnection 8 is connected to the pad 10, while the other end is connected to the pad 11. That is, the outer interconnection 8 connects the pad 10 and the pad 11. The inner interconnection 7 and the outer interconnection 8 in the present embodiment are manufactured as the same conductive layer, that is, at the same time in the same manufacturing process.

The pad 11, which has a circular planar shape, is provided at a side of the short side 2b of the pad 10, that is, on the primary surface 12 outside of the pad 10. The diameter of the pad 11 is, for example, 60 μm. A wire A3 for supplying a bias signal is connected to the surface of the pad 11. The active layer 3, the pad 10 and the pad 11 are sequentially arranged, along the long sides 2c, 2d.

In summary, the widths of the interconnections 6 to 8 along the short sides 2a, 2b are narrower than the diameters (widths) of the pads 9 to 11.

Figure 3:
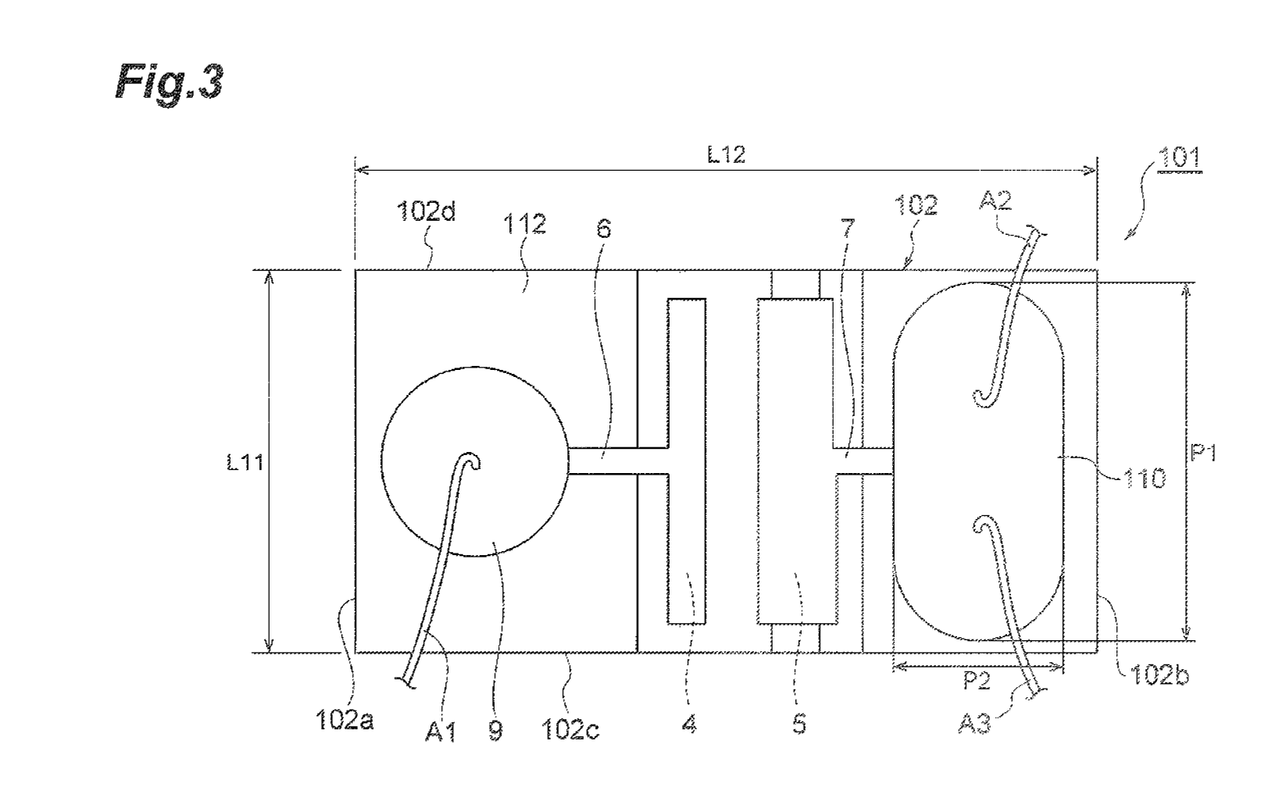
FIG. 3 is a plan view of a semiconductor laser diode according to a first comparative example.

Advantages obtained by the LD 1 of the present embodiment described above will be described. FIG. 3 is a plan view of a semiconductor laser diode according to a first comparative example. As illustrated in FIG. 3, in the semiconductor laser diode (LD) 101 according to the first comparative example, a pad 110 connected to the anode 5 has a rectangular shape whose corners are round, or an elliptical shape. In the pad 110, the maximum length P1 along short sides 102a, 102b is, for example, 180 μm, while the maximum length P2 along long sides 102c, 102d is, for example, 60 μm. The pad 110 is larger than the pad 9 connected to the cathode 4 according to the present embodiment illustrated in FIG. 1. This is because both wires A2, A3 are connected to the pad 110. If such a pad 110 is tried to be provided on a chip 102, the length L11 of die short sides 102a, 102b becomes, for example, 200 μm, and the length L12 of long sides 102c, 102d on the primary surface 112 becomes, for example, 360 μm. In the first comparative example, if the resonator length of the active layer is shortened to be approximately 100 μm in order to realize high-speed modulation of the LD 101, the lengths of the short sides 102a, 102b would be determined according to the maximum length P1 of the pad 110. That is, if the shape of the pad 110, particularly, the length of the pad 110 along the short sides 102a, 102b is determined based on the resonator length of the LD 101, it would be impossible to connect the wires A2, A3 to the pad 110 at the same time.

Figure 4:
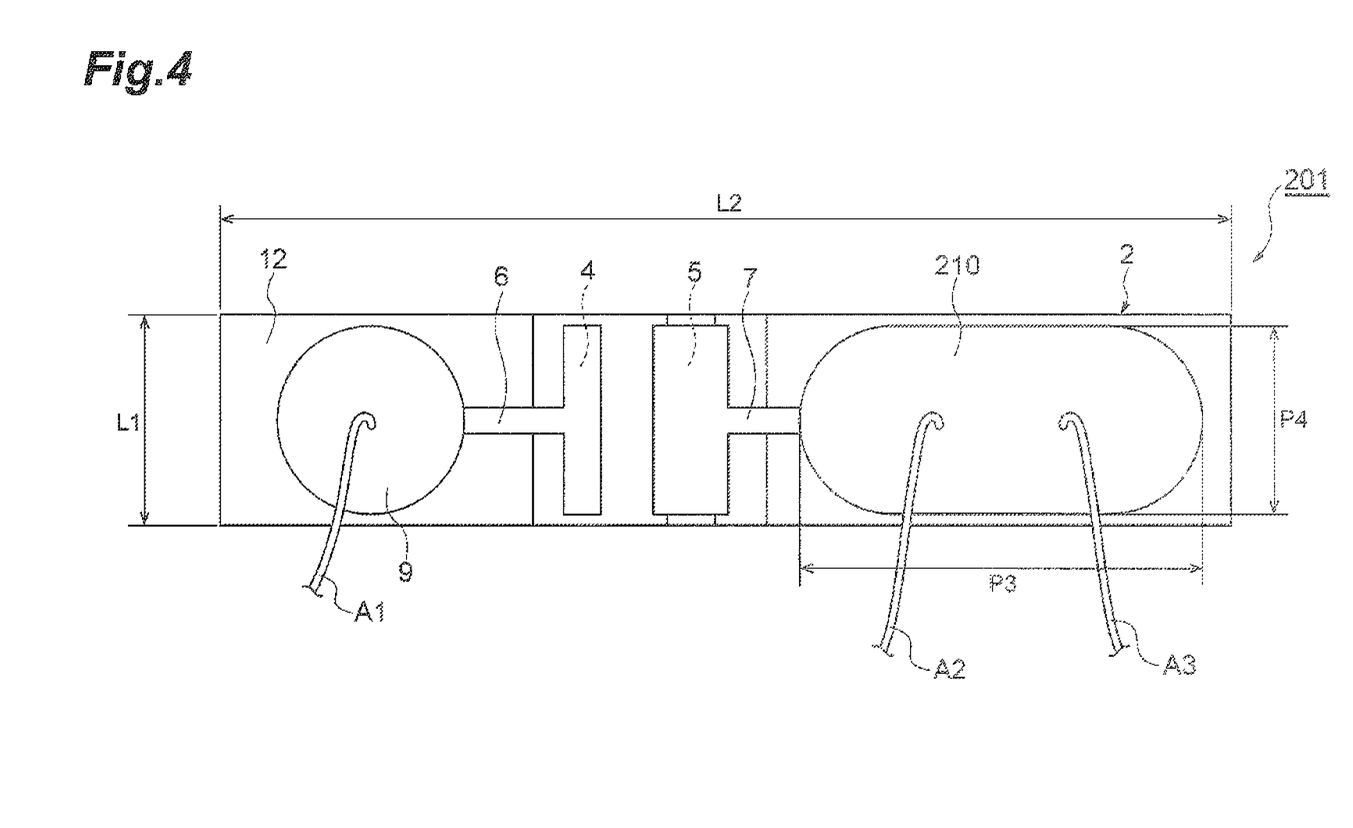
FIG. 4 is a plan view of a semiconductor laser diode according to a second comparative example.

FIG. 4 is a plan view of a semiconductor laser diode according to a second comparative example. As illustrated in FIG. 4, in the semiconductor laser diode 201 according to the second comparative example, a pad 210 connected to the anode 5 has an elliptical shape along the long sides of the chip 2. In the pad 210, the maximum length P3 along the long sides is, for example, 180 μm, while the maximum width P4 along the short sides is, for example, 60 μm. The planar shape of the pad 210 of the second comparative example is substantially the same as a shape obtained by rotating the pad 110 of the first comparative example by 90°. In this case, even if the resonator length of the active layer is shortened in order to realize high-speed modulation of the semiconductor laser diode 201, the size of the pad 210 is not affected. It is therefore possible to sufficiently secure design margin for wire bonding to the pad 210. However, because a modulation signal to be supplied to the pad 210 is affected by parasitic capacitance of the pad 210, in order to realize higher-speed modulation of the semiconductor laser diode 201, it is considered to, for example, reduce an area of the pad 210 to reduce parasitic capacitance of the pad 210.

In the LD 1 according to the present embodiment, the pad 10 and the pad 11 are connected to the anode 5 on the active layer 3. This structure of the LD 1 can connect the wire A2 for supplying a modulation signal to the pad 10 and connect the wire A3 for supplying a bias signal to the pad 11. The anode 5 on the active layer 3, the pad 10 and the pad 11 are sequentially arranged along the long sides 2c, 2d. This structure thereof can provide the pad 10 and the pad 11 having a predetermined area for connecting the wires A2 and A3 without inhibiting shortening of the resonator length of the active layer 3. In addition, the pad 10 and the pad 11 are connected using the outer interconnection 8 with a narrow width. This structure thereof can form a total area of the pad 10 and the pad 11 smaller than the area of the pad 210 of the above-described second comparative example. Therefore, parasitic capacitance of the pad 10 and the pad 11 becomes small. That is, it is possible to realize both shortening of the resonator length of the active layer 3 and reduction of parasitic capacitance of the pads 10, 11.

A modulation signal is input to the pad 10, while a bias signal is input to the pad 11, The pad 10 and the pad 11 are connected using the outer interconnection 8 with a narrow width, and the outer interconnection 8 can be constituted to have a relatively large inductance component, so that two pads 10, 11 can be easily separated at a high frequency. That is, a modulation signal to be input, to the pad 10 is less likely to be affected by the parasitic capacitance of the pad 11.

Figure 5:
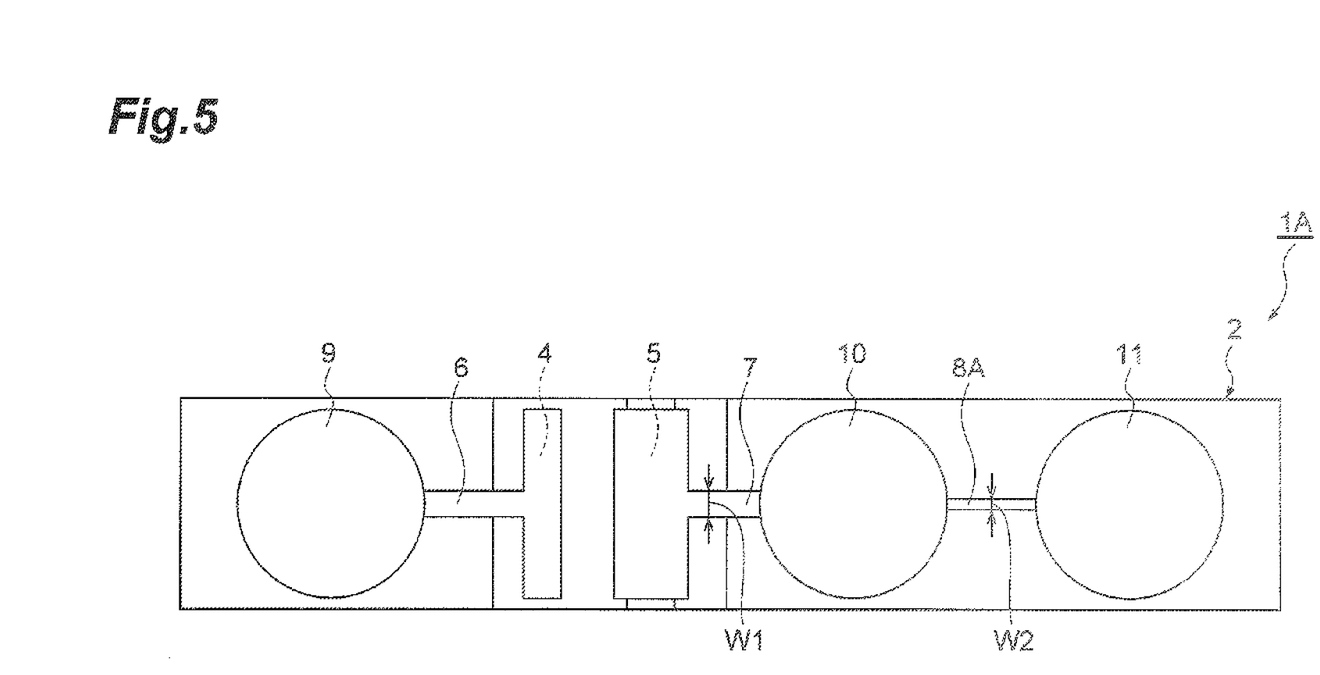
FIG. 5 is a plan view of a semiconductor laser diode according to a first modified example.

FIG. 5 is a plan view of a semiconductor laser diode according to a first modified example of the present embodiment. As illustrated in FIG. 5, the width of the outer interconnection 8A connecting the pad 10 and the pad 11 along the short sides 2a, 2b is narrower than the width of the inner interconnection 7. Specifically, the width W1 of the inner interconnection 7 is, for example, 40 μm, while the width W2 of the outer interconnection 8A is, for example, 10 μm The inner interconnection 7 substantially matches Impedance conditions when the anode 5 is viewed from the inner interconnection 7, and the outer interconnection 8A has larger impedance than the impedance. In this case, the pad 10 and the pad 11 are further separated at a high frequency.

Figure 6:
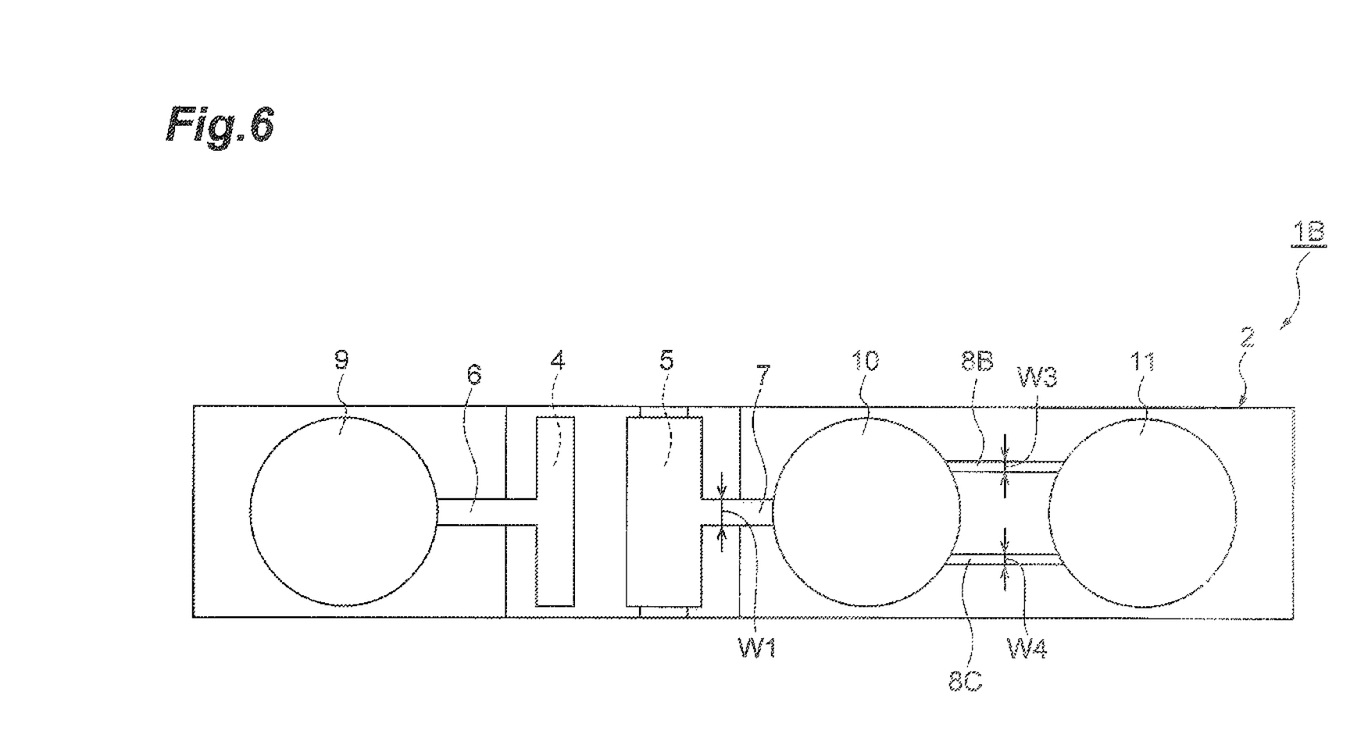
FIG. 6 is a plan view of a semiconductor laser diode according to a second modified example.

FIG. 6 is a plan view of a semiconductor laser diode according to a second modified example of the present embodiment. As illustrated in FIG. 6, the pad 10 and the pad 11 in the semiconductor laser diode 1B are connected using two outer interconnections 8B, 8C. The outer interconnections 8B, 8C are arranged in parallel, and the widths of the outer interconnections SB, 8C along the short sides 2a, 2b are narrower than the width of die inner interconnection 7. Specifically, the width W3 of the outer interconnection 8B and the width W4 of the outer interconnection 8C are, respectively, for example, 10 μm. Therefore, a total of the width W3 of the outer interconnection 8B and the width W4 of the outer interconnection 8C is narrower than the width of the inner interconnection 7 along the short sides, that is, 40 μm. The outer interconnections 8B, 8C have larger characteristic impedance than that of the inner interconnection 7. Also in this case, the pad 10 and the pad 11 are further separated at a high frequency compared to the outer interconnection 8A according to the above-described modified example. Overall resistance of the interconnections for connecting the pad 10 and the pad 11 is reduced. It is also possible to connect the pad 10 and the pad 11 through a plurality of interconnections in addition to the outer interconnections 8B, 8C. In this case, a total width of the plurality of interconnections along the short sides 2a, 2b is narrower than the widths of the pads 9 to 11 along the short sides 2a, 2b. The widths of these plurality of interconnections may be not uniform, but may vary.

A semiconductor laser diode according to the present invention are not limited to the above-described embodiment, and can be modified in various ways. For example, the shape of the primary surface 12 in the above-described embodiment and modified examples may be a square, a parallelogram or a quadrangle whose corners are round. The planer shape of the pads 9 to 11 in the above-described embodiment and modified examples is not limited to a circle, but may be a quadrangle, an ellipse or a polygon. In the embodiment according to the present invention, the LD 1 has been described where the lower cladding layer 31 has an n-type semiconductor, the upper cladding layer 32 has a p-type semiconductor, and the electrode 5 served as an anode is provided on the mesa 30, However, the arrangement of the interconnections according to the present invention can be also applied to a semiconductor laser diode in a similar manner where the lower cladding layer 31 has a p-type semiconductor, the upper cladding layer 32 has an n-type semiconductor, and the electrode 5 on the mesa 30 is a cathode.

A shape of a portion where the interconnection 6 overlaps with the pad 9 may be substantially the same as the shape of the pad 9 or different from the shape of the pad 9.

In the embodiment and modified examples according to the present invention, the semiconductor laser diode 1 capable of realizing high-speed modulation while preventing degradation of productivity may be provided.

What is claimed is:

1. A semiconductor laser diode including a primary surface constituted by two short sides and two long sides, comprising:
   an active layer having a direction of optical output along to the short sides of the primary surface;
   an electrode provided above the active layer to supply carriers within the active layer;
   a first pad provided on the primary surface, the first pad being connected to the electrode electrically;
   a second pad provided on the primary surface, the second pad being connected to the first pad electrically;
   an inner interconnection configured to connect the electrode to the first pad electrically, the inner interconnection being provided along the long sides; and
   an outer interconnection configured to connect the first pad to the second pad electrically, the outer interconnection being provided along the long sides, the outer interconnection having a width along the short sides narrower than a width of the first pad along the short sides and a width of the second pad along the short sides,
   wherein the active layer, the first pad, and the second pad are arranged along the long sides, and
   wherein the semiconductor laser diode is directly driven by a modulation signal provided to the first pad and a bias signal provided to the second pad.

2. The semiconductor laser diode of claim 1,
   wherein the inner interconnection has a width along the short sides wider than the width of the outer interconnection along the short sides.

3. The semiconductor laser diode of claim 2,
   wherein the outer interconnection includes a plurality of elementary interconnections each having respective widths along the short sides, and
   wherein the plurality of the elementary interconnections has a total width adding respective widths of the elementary interconnections shorter than the width of the inner interconnection.

4. The semiconductor laser diode of claim 1,
   wherein the inner interconnection has impedance substantially matched with impedance of the electrode viewed from the outer interconnection.

5. The semiconductor laser diode of claim 1,
further comprising a third pad, another electrode, and an interconnection each provided in a side opposite to the first pad with respect to the active layer, the interconnection electrically connecting the another electrode with the third pad.

6. The semiconductor laser diode of claim 5,
further comprising a mesa providing the electrode thereon, wherein the mesa includes a lower cladding layer, the active layer on the lower cladding layer, and an upper cladding layer on the active layer, the another electrode being electrically connected to the lower cladding layer and being provided in an outside of the mesa.

7. The semiconductor laser diode of claim 6,
wherein the mesa is put between grooves extending along the short sides, the inner interconnection traversing one of the grooves closer to the first pad, and
wherein the another electrode is electrically connected to the lower cladding layer and is provided in another of the grooves.

8. The semiconductor laser diode of claim 5,
wherein the electrode is an anode and the another electrode is a cathode.

9. The semiconductor laser diode of claim 5,
wherein the electrode is a cathode and the another electrode is an anode.

10. A semiconductor laser diode including a primary surface constituted by two short sides and two long sides, comprising:
an active layer having a direction of optical output along to the short sides of the primary surface;
an electrode provided above the active layer to supply carriers within the active layer;
a first pad provided on the primary surface, the first pad being connected to the electrode electrically;
a second pad provided on the primary surface, the second pad being connected to the first pad electrically;
an inner interconnection configured to connect the electrode to the first pad electrically, the inner interconnection being provided along the long sides; and
an outer interconnection configured to connect the first pad to the second pad electrically, the outer interconnection being provided along the long sides, the outer interconnection having a width along the short sides narrower than a width of the first pad along the short sides and a width of the second pad along the short sides,
wherein the active layer, the first pad, and the second pad are arranged along the long sides,
wherein the inner interconnection has a width along the short sides wider than the width of the outer interconnection along the short sides,
wherein the outer interconnection includes a plurality of elementary interconnections each having respective widths along the short sides, and
wherein the plurality of the elementary interconnections has a total width adding respective widths of the elementary interconnections shorter than the width of the inner interconnection.

11. A semiconductor laser diode including a primary surface constituted by two short sides and two long sides, comprising:
an active layer having a direction of optical output along to the short sides of the primary surface;
an electrode provided above the active layer to supply carriers within the active layer;
a first pad provided on the primary surface, the first pad being connected to the electrode electrically;
a second pad provided on the primary surface, the second pad being connected to the first pad electrically;
an inner interconnection configured to connect the electrode to the first pad electrically, the inner interconnection being provided along the long sides;
an outer interconnection configured to connect the first pad to the second pad electrically, the outer interconnection being provided along the long sides, the outer interconnection having a width along the short sides narrower than a width of the first pad along the short sides and a width of the second pad along the short sides;
a third pad, another electrode, and an interconnection each provided in a side opposite to the first pad with respect to the active layer, the interconnection electrically connecting the another electrode with the third pad, and
a mesa providing the electrode thereon,
wherein the active layer, the first pad, and the second pad are arranged along the long sides,
wherein the mesa includes a lower cladding layer, the active layer on the lower cladding layer, and an upper cladding layer on the active layer, the another electrode being electrically connected to the lower cladding layer,
wherein the mesa is put between grooves extending along the short sides, the inner interconnection traversing one of the grooves closer to the first pad, and
wherein the another electrode is provided in another of the grooves.

* * * * *